US008592244B2

(12) United States Patent
Gambino et al.

(10) Patent No.: US 8,592,244 B2
(45) Date of Patent: Nov. 26, 2013

(54) PIXEL SENSOR CELLS AND METHODS OF MANUFACTURING

(75) Inventors: Jeffrey P. Gambino, Westford, VT (US); Robert K. Leidy, Burlington, VT (US); Mark D. Levy, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 13/189,961

(22) Filed: Jul. 25, 2011

(65) Prior Publication Data
US 2013/0026587 A1 Jan. 31, 2013

(51) Int. Cl.
*H01L 21/00* (2006.01)
(52) U.S. Cl.
USPC ....... 438/72; 257/294; 257/435; 257/E31.122
(58) Field of Classification Search
USPC ..................... 257/E31.122; 438/72
See application file for complete search history.

(56) References Cited

U.S. PATENT DOCUMENTS

| 4,268,607 A | 5/1981 | Tada |
| 4,690,838 A | 9/1987 | Hiraoka et al. |
| 5,096,842 A | 3/1992 | Nihira et al. |
| 2006/0029868 A1 | 2/2006 | Huang |
| 2006/0092353 A1* | 5/2006 | Kim et al. ............. 349/110 |
| 2007/0279502 A1* | 12/2007 | Inoue ............. 348/272 |
| 2008/0111159 A1* | 5/2008 | Gambino et al. ............. 257/225 |
| 2009/0020838 A1* | 1/2009 | Lin et al. ............. 257/432 |

OTHER PUBLICATIONS

Orvek et al., "Carbonized layer formation in ion implanted photoresist masks", Nuclear Instruments and Methods in Physics Research Section B: Beam Interactions with Materials and Atoms, vol. 7-8, Part 2, Mar. 1985, Abstract Only.

* cited by examiner

*Primary Examiner* — Michelle Mandala
*Assistant Examiner* — Shaka White
(74) *Attorney, Agent, or Firm* — Anthony Canale; Roberts Mlotkowski Safran & Cole, P.C.

(57) ABSTRACT

Pixel sensor cells with an opaque mask layer and methods of manufacturing are provided. The method includes forming a transparent layer over at least one active pixel and at least one dark pixel of a pixel sensor cell. The method further includes forming an opaque region in the transparent layer over the at least one dark pixel.

18 Claims, 4 Drawing Sheets

# PIXEL SENSOR CELLS AND METHODS OF MANUFACTURING

FIELD OF THE INVENTION

The invention relates to pixel sensor cells and methods of manufacturing and, more particularly, to pixel sensor cells with an opaque mask layer and methods of manufacturing.

BACKGROUND

Pixel sensor cells (e.g., CMOS imagers) can suffer from background noise due to thermal carrier generation, i.e., stray light. To compensate for such unwanted noise, i.e., stray light, conventional pixel sensor cells require "dark pixels". The dark pixels are formed by an aluminum light shield over the dark pixels, and surrounding the peripheral of the active devices, e.g., photo cell collector regions. In conventional structures, the aluminum light shield is formed on an upper wiring layer, e.g., third or fourth wiring level, over the dark pixels. In theory, the aluminum shield blocks light from hitting the transistor structures, i.e., dark pixels, rendering the dark pixels insensitive to photons. This, in turn, allows these dark pixels to generate an accurate reference signal. The reference signal can then be subtracted from the total charge signal to allow a sensor to measure the dark level offset used in downstream signal processing to perform auto black level calibration, for example.

Under normal circumstances, the dark pixels do not respond to light; however, the dark pixels are in close proximity to the active pixels, i.e., photo cell collector regions, or the outer bounds of the chip (including the first two lines out) such that they can scavenge signals depending on light intensity and wavelength. More specifically, due to the location of the aluminum shield in the upper wiring layer, it is common for incident stray light to strike the dark pixels. This is mainly due to the location and size of the light shield and angle of attack of the incident light, which can enter beneath the light shield. The dark signals therefore will not represent the true dark signal. Also, it is known that the aluminum shield adds material complexities to the fabrication process, in addition to using valuable real estate on the chip, that can otherwise be used for other wiring and/or device fabrication.

Another approach to block light from striking the dark pixels is to use a black resist. However, a black resist is extremely hard to process. For example, the dark resist covers alignment marks on the wafer. That is, a dark resist interferes with alignment and overlay measurements during processing. Also, the black resist is difficult to image through, and is very expensive from a material standpoint. Accordingly, it is not practical to use a black resist.

Accordingly, there exists a need in the art to overcome the deficiencies and limitations described hereinabove.

SUMMARY

In an aspect of the invention, a method comprises forming a transparent layer over at least one active pixel and at least one dark pixel of a pixel sensor cell. The method further comprises forming an opaque region in the transparent layer over the at least one dark pixel.

In an aspect of the invention, a method of forming a pixel sensor cell comprises forming at least one active pixel on a substrate comprises at least a photo cell collector region and a floating diffusion. The method further comprises forming at least one dark pixel on the substrate, adjacent to the at least one active pixel. The method further comprises forming a transparent layer over the at least one active pixel and the at least one dark pixel. The transparent layer is structured to allow incident light to pass through to reach the photo cell collector region of the at least one active pixel. The method further comprises selectively converting a portion of the transparent layer to an opaque region structured to block the light from striking the at least one dark pixel.

In an aspect of the invention, a structure comprises at least one active pixel comprising at least a photo cell collector region and a floating diffusion. The structure further comprises at least one dark pixel, adjacent to the at least one active pixel. The structure further comprises a transparent layer over the at least one active pixel structured to allow incident light to pass through to reach the photo cell collector region. A portion of the transparent layer comprises an opaque region structured to block light from striking the at least one dark pixel and accompanying circuitry.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the pixel sensor cells (PSC), which comprises the structures of the present invention. In still further embodiments, a method in a computer-aided design system is provided for generating a functional design model of the PSC. The method comprises generating a functional representation of the structural elements of the PSC.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to pixel sensor cells and methods of manufacturing and, more particularly, to pixel sensor cells with an opaque mask layer and methods of manufacturing. In embodiments, the opaque mask layer is formed by an implantation process of a transparent resist layer, to convert a top surface of the resist layer to an opaque film. In embodiments, the implantation can include, for example, Argon (Ar), Krypton (Kr) and Xenon (Xe), as well as Germanium (Ge), Silicon (Si), Phosphorous (P), Antimony (Sb), Arsenic (As) or other non-metal heavy ions.

More specifically, the present invention relates to a method and structures of selectively converting a portion of a transparent layer (e.g., photoresist layer) to an opaque region (e.g. black-like resist). In embodiments, the opaque region is structured to block light incident on a pixel sensor cell (e.g., light shield formed over dark pixels and support circuits); whereas, other non-converted portions of the transparent resist layer are structured to allow the incident light to pass through to reach a photosensitive region of the pixel sensor cell. For example, according to an embodiment of the invention, the method comprises forming a photoresist layer, as a planarizing layer, selectively introducing a species (e.g., implanting Ar) into a portion of the photoresist layer to form an opaque region in the pixel sensor cell. This opaque region blocks incident light from reaching sensitive areas of the pixel sensor cell (i.e., dark pixels).

Advantageously, the method and structures of the present invention provide an opaque film over dark pixels and support circuits, but does not interfere with alignment and overlay measurements during processing. Also, the use of the opaque region, e.g., film, can eliminate the need for an aluminum shield thus reducing fabrication complexities, as well as creating additional space for other active or passive devices on the upper wiring layers. In addition, the use of the opaque film provides a larger coverage area reducing the possibility that incident light will strike the dark pixels.

Figure 1:
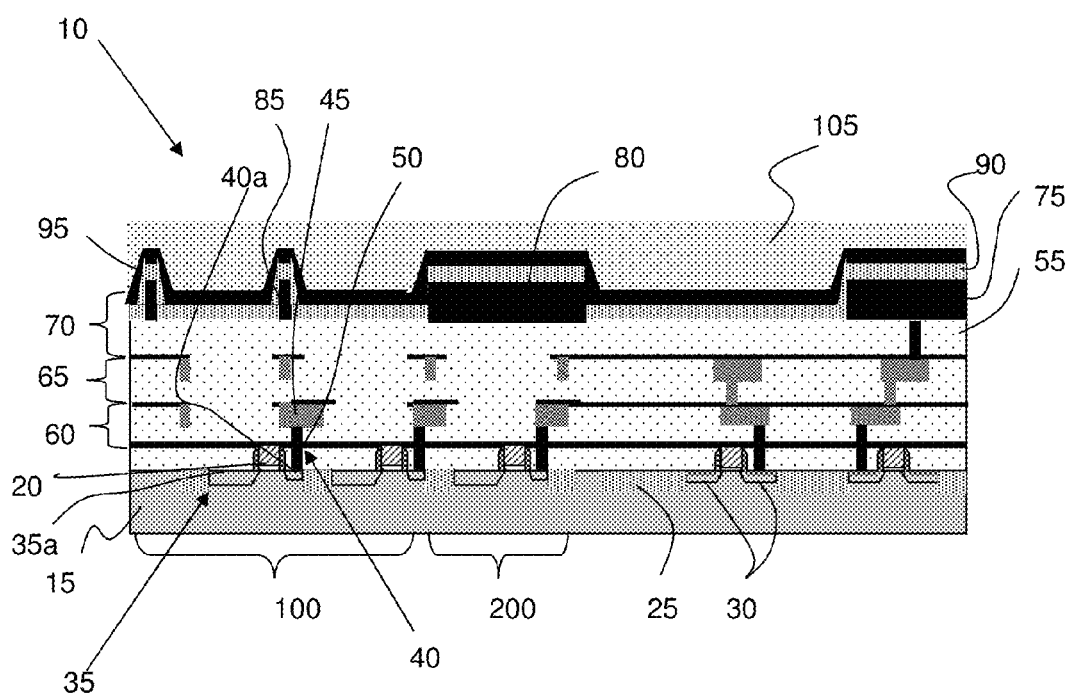
FIGS. 1-4 show structures and respective manufacturing processes of a pixel sensor cell in accordance with aspects of the invention.

FIG. 1 shows a structure and method of manufacturing a pixel sensor cell in accordance with aspects of the invention. The structure 10 of FIG. 1 is fabricated using conventional CMOS fabrication processes known to those of skill in the art. For example, the structure 10 is fabricated using conventional lithographic, deposition and etching processes. For example, deposition processes can include chemical vapor deposition (CVD), plasma enhanced CVD (PECVD), atmospheric pressure CVD (APCVD), low-pressure CVD (LPCVD), and atomic layer CVD (ALCVD), amongst other deposition processes. The etching can be, for example, a conventional reactive ion etching (RIE) process.

In particular, the structure 10 includes at least one active pixel 100 (i.e., photo collector region) and at least one dark pixel 200 formed on a substrate 15. The substrate 15 can be any conventional substrate such as, for example, Si or SiGe to name a few substrate materials. In embodiments, the substrate 15 can be Silicon-On Insulator (SOI). The at least one active pixel 100 and at least one dark pixel 200 include transistors (e.g., gate structures) 20 formed on the substrate 15. For example, the gate structures 20 comprise a gate dielectric layer formed on the substrate 15, with a polysilicon or metal gate material formed on the gate dielectric layer. The gate dielectric layer and the polysilicon or metal gate material can be deposited and then subjected to a conventional patterning process (i.e., lithographic and etching processes) to form the gate structures 20.

In embodiments, the gate dielectric can be $SiO_2$, oxide, oxynitride or other insulator materials. The gate dielectric can also be a high-k stack such as, for example, $HfO_2$, Hf Silicate, etc, with the bottom layer being, for example, $SiO_2$. The gate dielectric can have a thickness of about 5 nm to about 50 nm, with a thick dielectric reducing leakage. The gate structures 20 also include sidewalls or spacers comprising, for example, SiN or other such material. The adjacent gate structures 20 are electrically and physically isolated from one another by shallow trench isolation (STI) structures 25, formed by conventional processes.

The substrate includes conventionally formed source and drain regions 30, using known P-type and N-type dopants. In embodiments, the source and drain regions 30 can be formed by a doping or ion implantation process. A photo cell collector region 35 of the at least one active pixel 100 includes a source region 35a and a floating diffusion 40 includes, for example, a drain 40a of the at least one active pixel 100. The drain 40a is connected to an upper metal wiring 45, through a metal contact 50. The metal contact 50 can be, for example, tungsten, and the metal wiring 45 can be aluminum, for example. The metal wiring 45 and metal contact 50 are formed in an interlevel dielectric 55, at a first wiring level 60.

The metal wiring 45 and metal contact 50 can be formed by conventional lithographic, etching and deposition processes (i.e., subtractive or additive metal processes). Subsequent wiring levels 65 are formed in a similar manner, comprising metal wiring and contacts formed in an interlevel dielectric material.

An upper wiring level 70 is formed on a surface of the upper subsequent wiring level 65. In embodiments, the upper wiring level 70 includes a conductive (e.g., aluminum) bond pad 75 and an optional aluminum shield 80, as well as additional wiring 85, e.g., aluminum wiring. In accordance with aspects of the invention, the aluminum shield 80 can be removed from the structure of the present invention, in order to provide additional space for other passive and/or active devices. The bond pad 75, optional aluminum shield 80 and wiring 85 can be formed using conventional metal deposition processes, followed by a patterning and etching process.

An oxide layer 90 and nitride layer 95 are formed over the bond pad 75, optional aluminum shield 80 and wiring 85, using conventional deposition processes. In embodiments, the oxide layer 90 can be, for example, $SiO_2$ or other insulating material. The nitride layer 95 can be, for example, SiN. In embodiments, the layers 90 and 95 can be a single or multiple layers of, for example, oxynitride or silicon oxynitride. A transparent (non-black layer) layer 105 is deposited on the layer 95. In embodiments, the transparent layer 105 is a transparent resist. The transparent resist 105 forms a nearly planar layer because of the spin-on coating process. In embodiments, the thickness of the resist can range from about 0.5 microns to about 5 microns.

Figure 2:
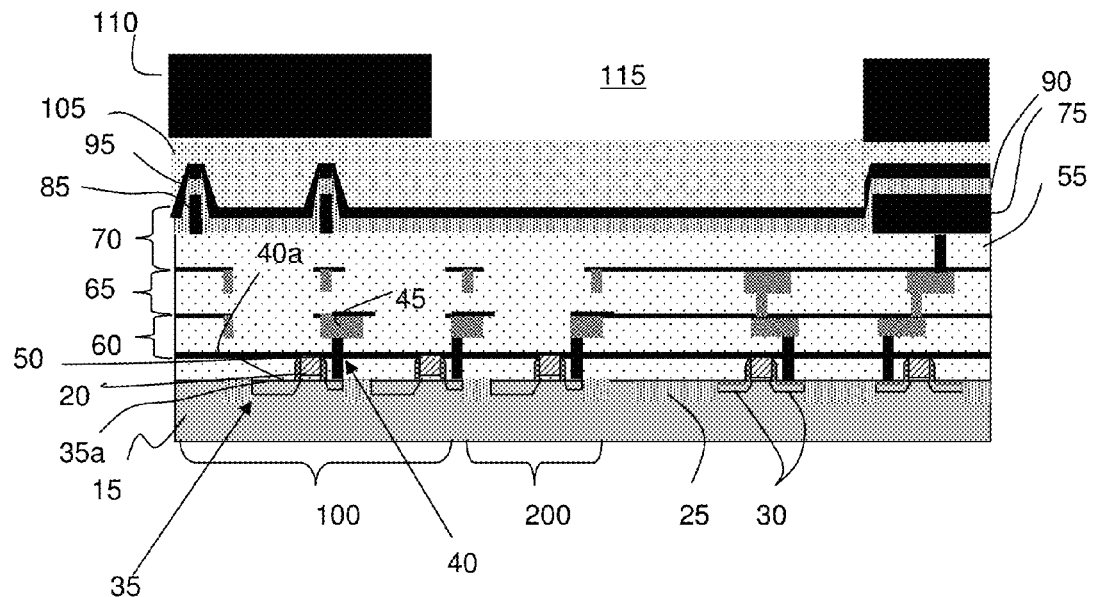

FIG. 2 shows additional fabrication processes and a respective structure in accordance with aspects of the present invention. FIG. 2 shows the aluminum shield removed from the structure. In FIG. 2, a mask 110 is formed on the transparent resist 105, and patterned to form an opening 115. In embodiments, the mask 110 can be a low temperature oxide mask, deposited on the transparent resist 105. The mask 110 can be patterned using conventional lithographic processes to form the opening 115, which may extend from an edge of the bond pad 75 to an edge of the active pixel 100, e.g., over the dark pixels 200. In this way, the mask 110 will cover the transparent resist 105 over the active pixel 100, during subsequent implantation processes. In embodiments, the opening 115 can extend beyond the edge of the bond pad 75, depending on the process flow.

Figure 3:
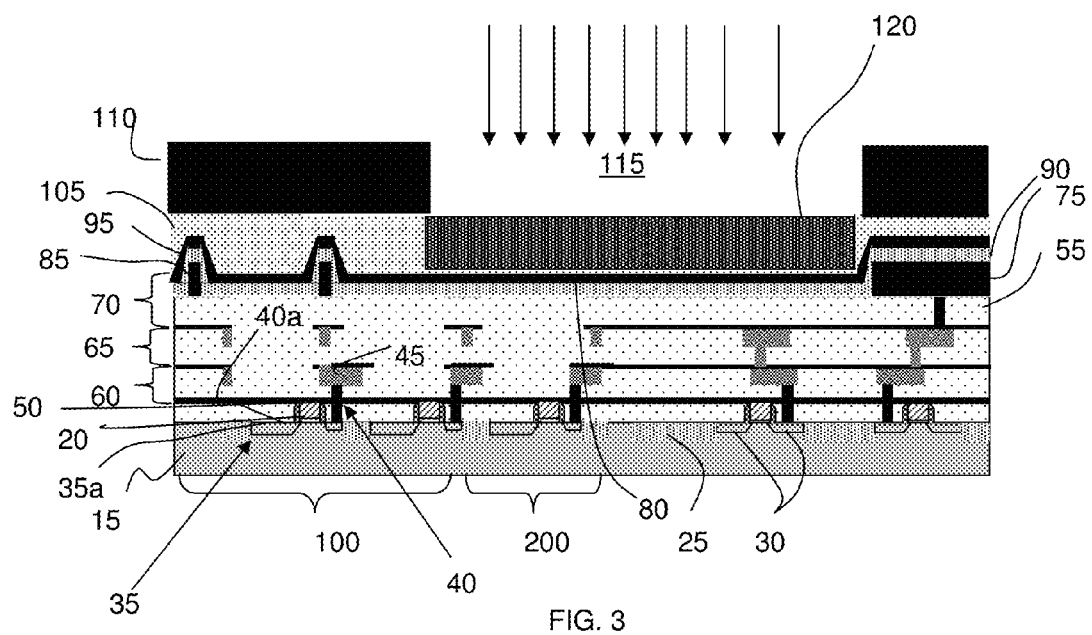

In FIG. 3, the transparent resist 105 is subjected to an implantation process to form an opaque region (e.g., opaque film) 120. The opaque region 120 will cover the dark pixel 200 and any accompanying circuitry, while the mask 110 will protect the transparent resist 105 over the active pixel 100 during the implantation process. The implantation process can include implanting, for example, Argon (Ar), Krypton (Kr) or Xenon (Xe), as well as Germanium (Ge), Silicon (Si), Phosphorous (P), Antimony (Sb), Arsenic (As) or other non-metal heavy ions. In one exemplary embodiment, Ar is implanted at a dose of approximately $1E15$ $cm^{-2}$ to about $2E16$ $cm^{-2}$ at an energy level of about 20 KeV to about 500 keV.

In embodiments, the opaque region 120 is about the same thickness of the transparent resist 105. For example, the opaque region 120 can have a thickness of about 0.5 microns to about 5 microns, tailored to the thickness of the transparent resist 105. In embodiments, the opaque region 120 will stop at the layer 95, so as to not damage such layer. This can be accomplished by controlling the dosage and/or energy level of the implant species. Also, the opaque region 120 is not directly over the active pixel 100 due to the mask 110 blocking the implant species over such area. Thus, the process provides an opaque film over dark pixels and support circuits, but does not interfere with alignment and overlay measurements during processing.

Figure 4:
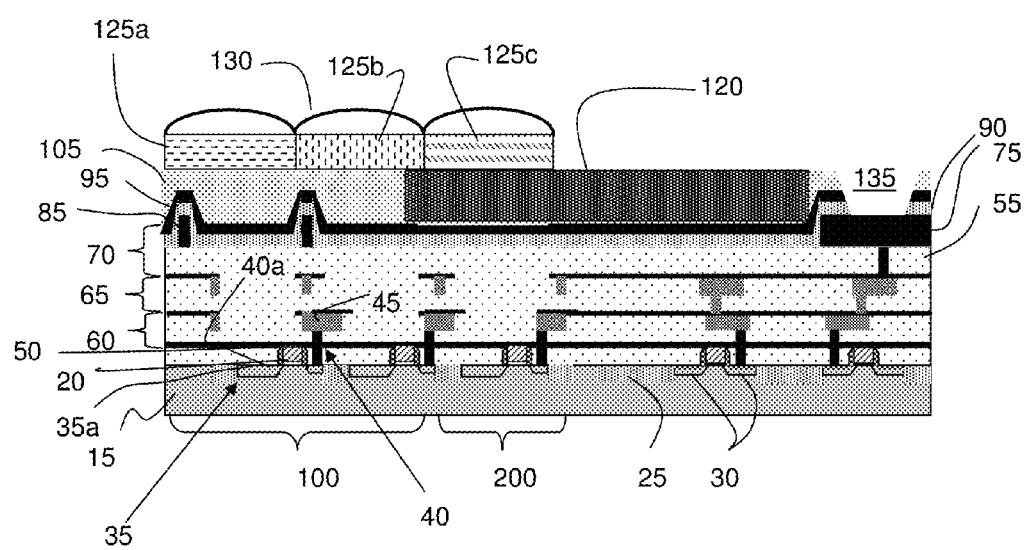

In FIG. 4, the mask 110 is removed using conventional processes such as DHF. Color filters 125a, 125b and 125c are deposited and patterned on the transparent resist 105. In embodiments, the color filters 125a, 125b and 125c can be any number of filters, and can be formed partly or fully over the opaque region 120. In embodiments, the color filters 125a, 125b and 125c can be formed using conventional processes such as, for example, the deposition and patterning of resist with metal particles or pigmentation to filter out certain wavelengths of light. Transparent lenses 130 are formed on the filters 125a, 125b and 125c. A through via 135 is formed in the resist 105 to expose a surface of the bond pad 75.

Figure 5:
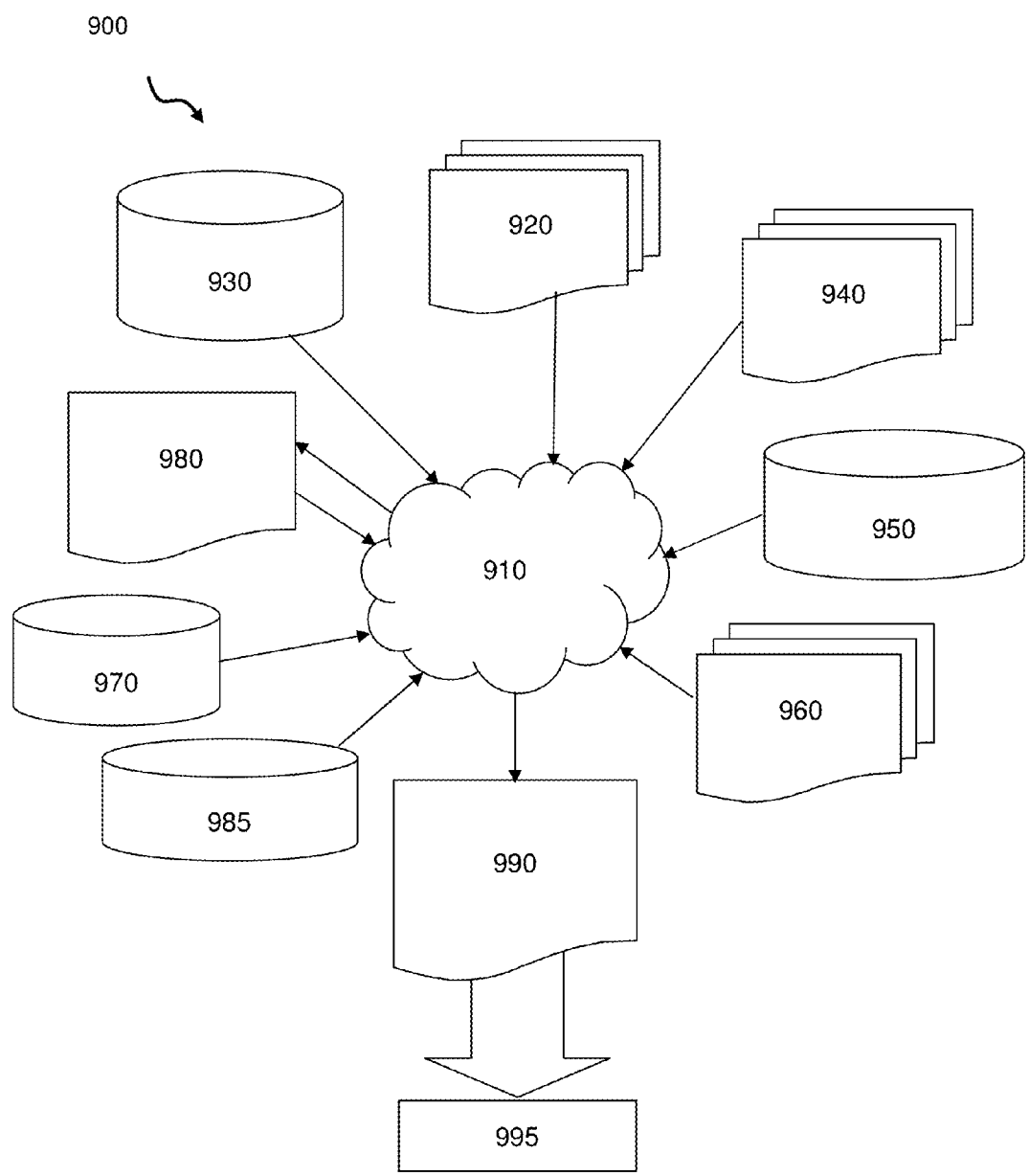
FIG. 5 is a flow diagram of a design process used in semiconductor design, manufacture, and/or test.

FIG. 5 is a flow diagram of a design process used in semiconductor design, manufacture, and/or test. FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 990 may comprise a compiled, executable HDL simulation model that functionally simulates the devices shown in FIGS. 1-4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed:

1. A method, comprising:
   forming a transparent layer over at least one active pixel and at least one dark pixel of a pixel sensor cell; and
   forming an opaque region in the transparent layer over the at least one dark pixel,
   wherein the forming of the opaque region corn rises implanting a species in the transparent layer over the at least one dark pixel.

2. The method of claim 1, wherein the forming the opaque region is formed in the transparent layer over support circuitry associated with the at least one dark pixel.

3. The method of claim 1, wherein the species is Argon (Ar).

4. The method of claim 1, wherein the species is one of Argon (Ar), Krypton (Kr) and Xenon (Xe), as well as Germanium (Ge), Silicon (Si), Phosphorous (P), Antimony (Sb), Arsenic (As) and other non-metal heavy ions.

5. The method of claim 1, wherein the at least one active pixel is formed with a photo cell collector region and a floating diffusion.

6. The method of claim 1, wherein the opaque region is a film with a thickness of about the transparent layer.

7. The method of claim 1, wherein the forming of the opaque region avoids interfering with alignment marks and overlay measurements during processing.

8. The method of claim 1, wherein the opaque region is a light blocking layer in an image sensor over the at least one dark pixel and support circuits.

9. The method of claim 1, wherein the opaque region is a selectively converted portion of the transparent layer, which is structured to block light incident upon a pixel sensor cell comprising the at least one dark pixel.

10. A method, comprising:
    forming a transparent layer over at least one active pixel and at least one dark pixel of a pixel sensor cell; and
    forming an opaque region in the transparent layer over the at least one dark pixel; wherein the forming the opaque region comprises
    forming a mask layer on the transparent layer to protect portions of the transparent layer during an implantation, thereby resulting in a non-converted portion of the transparent layer structured to allow incident light to pass through to reach a photosensitive region of the at least one active pixel of the pixel sensor cell.

11. The method of claim 1, wherein the transparent layer is planarly formed by a spin on process, and light filters and lenses are formed on the planarized transparent layer.

12. A method of forming a pixel sensor cell, comprising:
    forming at least one active pixel on a substrate comprising at least a photo cell collector region and a floating diffusion;
    forming at least one dark pixel on the substrate, adjacent to the at least one active pixel;
    forming a transparent layer over the at least one active pixel and the at least one dark pixel, the transparent layer structured to allow incident light to pass through to reach the photo cell collector region of the at least one active pixel; and
    selectively converting a portion of the transparent layer to an opaque region structured to block the light from striking the at least one dark pixel,
    wherein the selectively converting comprises forming a mask layer on the transparent layer over the at least one active pixel and implanting a species in exposed portions of the transparent layer to form the opaque region.

13. The method of claim 12, wherein the transparent layer is a non-black resist layer.

14. A method of forming a pixel sensor cell, comprising:
forming at least one active pixel on a substrate comprising at least a photo cell collector region and a floating diffusion;
forming at least one dark pixel on the substrate, adjacent to the at least one active pixel;
forming a transparent layer over the at least one active pixel and the at least one dark pixel, the transparent layer structured to allow incident light to pass through to reach the photo cell collector region of the at least one active pixel; and
selectively converting a portion of the transparent layer to an opaque region structured to block the light from striking the at least one dark pixel,
wherein the selectively converting comprises selectively implanting Argon in the transparent layer over the at least one dark pixel and accompanying circuitry to form the opaque region over the at least one dark pixel and accompanying circuitry.

15. A method of forming a pixel sensor cell, comprising:
forming at least one active pixel on a substrate comprising at least a photo cell collector region and a floating diffusion;
forming at least one dark pixel on the substrate, adjacent to the at least one active pixel;
forming a transparent layer over the at least one active pixel and the at least one dark pixel, the transparent layer structured to allow incident light to pass through to reach the photo cell collector region of the at least one active pixel; and
selectively converting a portion of the transparent layer to an opaque region structured to block the light from striking the at least one dark pixel,
wherein the selectively converting comprises forming a mask layer to protect the transparent layer over the at least one active pixel from an implantation process which forms the opaque region.

16. A method of forming a pixel sensor cell, comprising:
forming at least one active pixel on a substrate comprising at least a photo cell collector region and a floating diffusion;
forming at least one dark pixel on the substrate, adjacent to the at least one active pixel;
forming a transparent layer over the at least one active pixel and the at least one dark pixel, the transparent layer structured to allow incident light to pass through to reach the photo cell collector region of the at least one active pixel; and
selectively converting a portion of the transparent layer to an opaque region structured to block the light from striking the at least one dark pixel,
wherein the selectively converting comprises selectively implanting a species comprising one of Argon (Ar), Krypton (Kr) and Xenon (Xe), as well as Germanium (Ge), Silicon (Si), Phosphorous (P), Antimony (Sb), Arsenic (As) and other non-metal heavy ions.

17. The method of claim 12, wherein the selectively converting comprises forming a light blocking opaque region in the transparent layer.

18. A structure comprising:
at least one active pixel comprising at least a photo cell collector region and a floating diffusion;
at least one dark pixel, adjacent to the at least one active pixel;
a transparent layer over the at least one active pixel structured to allow incident light to pass through to reach the photo cell collector region; and
a portion of the transparent layer comprising an opaque region structured to block light from striking the at least one dark pixel and accompanying circuitry,
wherein the opaque region comprises an implanted species in the transparent layer over the at least one dark pixel.

\* \* \* \* \*